(12) United States Patent
Fujiwara et al.

(10) Patent No.: US 11,152,301 B2
(45) Date of Patent: Oct. 19, 2021

(54) MEMORY CELL HAVING MULTI-LEVEL WORD LINE

(71) Applicant: TAIWAN SEMICONDUCTOR MANUFACTURING COMPANY, LTD., Hsinchu (TW)

(72) Inventors: Hidehiro Fujiwara, Hsinchu (TW); Li-Wen Wang, Taichung (TW); Yen-Huei Chen, Jhudong Township (TW); Hung-Jen Liao, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/511,997

(22) Filed: Jul. 15, 2019

(65) Prior Publication Data

US 2019/0341346 A1    Nov. 7, 2019

Related U.S. Application Data

(62) Division of application No. 14/528,337, filed on Oct. 30, 2014, now Pat. No. 10,354,952.

(51) Int. Cl.
| | |
|---|---|
| *H01L 27/11* | (2006.01) |
| *H01L 23/528* | (2006.01) |
| *H01L 23/522* | (2006.01) |
| *H01L 27/02* | (2006.01) |
| *G06F 30/394* | (2020.01) |

(52) U.S. Cl.
CPC .......... *H01L 23/528* (2013.01); *G06F 30/394* (2020.01); *H01L 23/5226* (2013.01); *H01L 27/0207* (2013.01); *H01L 27/1104* (2013.01); *H01L 2924/0002* (2013.01)

(58) Field of Classification Search
CPC combination set(s) only.
See application file for complete search history.

(56) References Cited

U.S. PATENT DOCUMENTS

| | | |
|---|---|---|
| 7,969,766 B2 | 6/2011 | Nii |
| 2008/0099812 A1 | 5/2008 | Nagata et al. |
| 2008/0191270 A1 | 8/2008 | Kinoshita |

(Continued)

*Primary Examiner* — Suberr L Chi
(74) *Attorney, Agent, or Firm* — Hauptman Ham, LLP

(57) ABSTRACT

A method of designing a memory circuit is provided that includes generating a layout of a first memory cell using an integrated circuit design system. The layout of the first memory cell is generated by routing a first word line in a first layer on a first level, and routing a second word line in the first layer. Also, the method includes generating a layout of a second memory cell using the integrated circuit design system. The layout of the second memory cell is generated by routing a third word line in the first layer, the second word line being between the first word line and the third word line, and routing a fourth word line in the first layer, the third word line being between the second word line and the fourth word line. Moreover, the method includes assigning a first color scheme to the first word line and to the third word line, and assigning a second color scheme to the second word line and to the fourth word line. The first color scheme is associated with a first manufacturing process using a first mask and the second color scheme is associated with a second manufacturing process using a second mask.

20 Claims, 12 Drawing Sheets

(56) References Cited

U.S. PATENT DOCUMENTS

| | | |
|---|---|---|
| 2011/0018051 A1 | 1/2011 | Kim et al. |
| 2013/0250689 A1 | 9/2013 | Lai et al. |
| 2013/0272056 A1 | 10/2013 | Liaw |
| 2014/0254246 A1 | 9/2014 | Liaw |
| 2015/0318241 A1* | 11/2015 | Chang .................. H01L 23/528 257/773 |
| 2016/0027499 A1 | 1/2016 | Liaw |
| 2016/0056210 A1 | 2/2016 | Takaki |

* cited by examiner

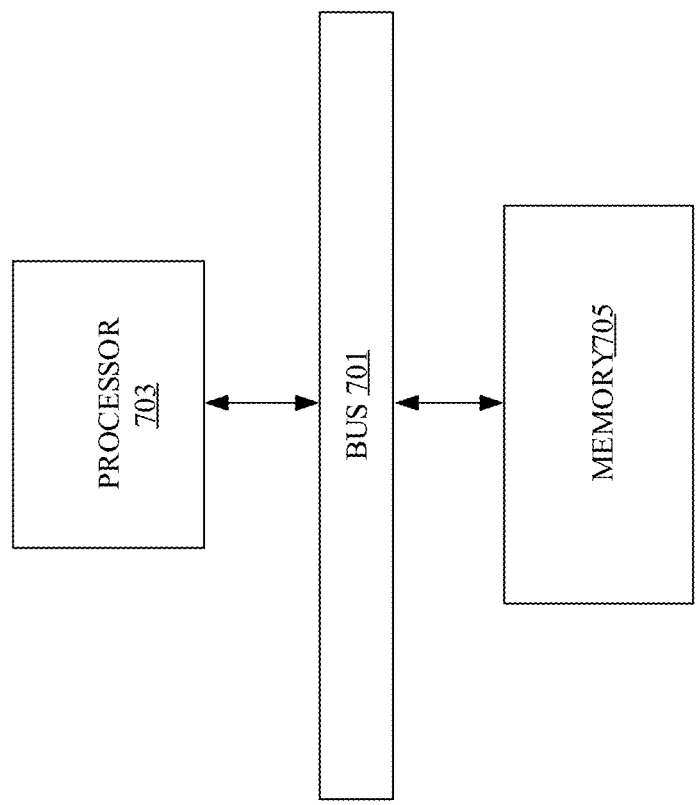

MEMORY CELL HAVING MULTI-LEVEL WORD LINE

PRIORITY CLAIM

The present application is a divisional of U.S. application Ser. No. 14/528,337, filed Oct. 30, 2014, which is incorporated herein by reference in its entirety.

BACKGROUND

The semiconductor integrated circuit (IC) industry has experienced growth. Technological advances in IC materials and design have produced generations of ICs, where each generation has smaller and more complex circuits than the previous generation. In the course of integrated circuit evolution, functional density (i.e., the number of interconnected devices per chip area) has generally increased while geometry size (i.e., the smallest component or line that can be created using a fabrication process) has decreased. When the width of a conductive line becomes smaller, the unit-length resistance of the conductive line becomes greater, and vice versa. In some applications, a digital signal transmitted on a conductive line has a longer rising or falling time when the unit-length resistance thereof becomes greater. In other words, the unit-length resistance of a conductive line limits an operating frequency of a digital signal transmitted thereon.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2Ad is a cross-sectional view of a subset of memory cell features illustrated in FIG. 2Aa, in accordance with one or more embodiments.

FIG. 7 is a functional block diagram of a computer or processor-based system upon which or by which an embodiment is implemented.

DETAILED DESCRIPTION

Figure 1A:
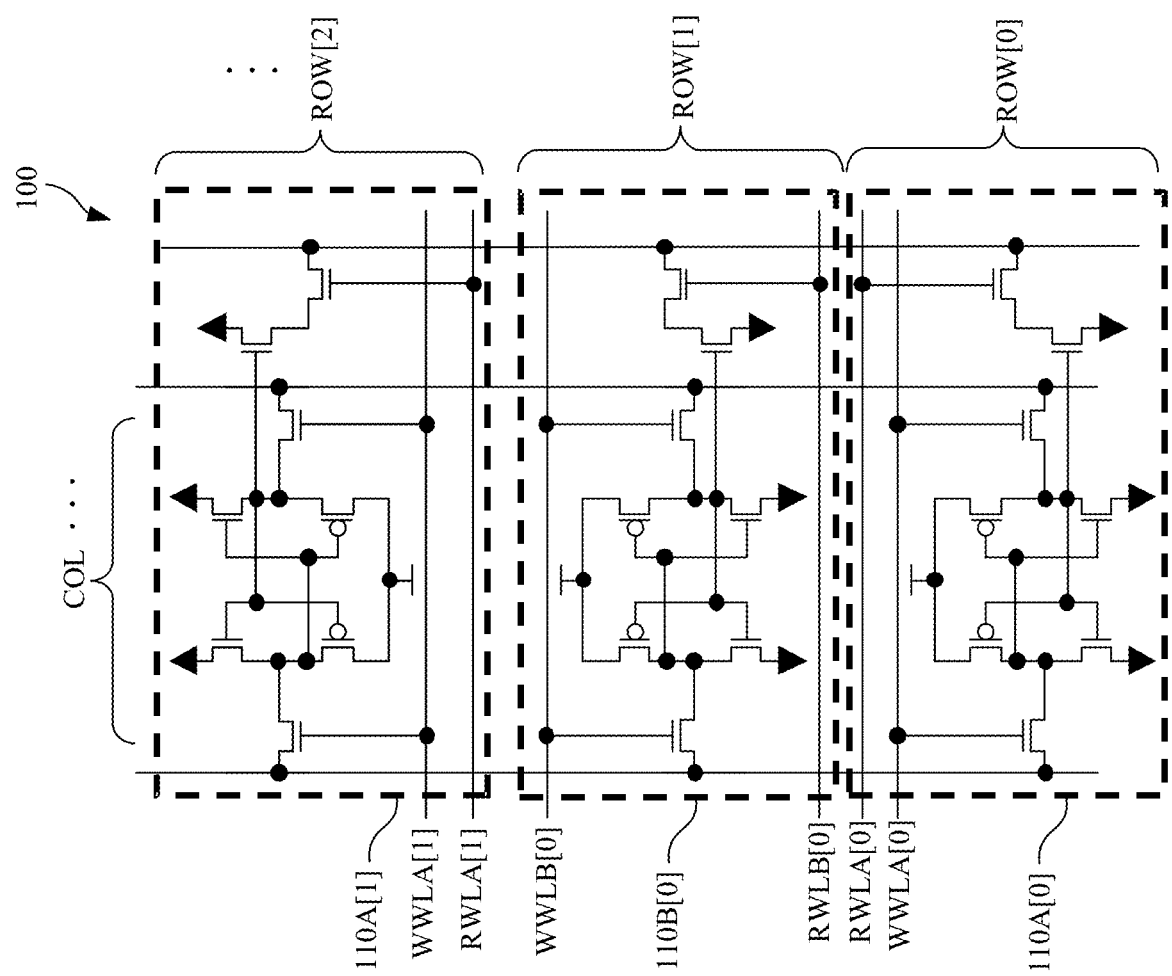
FIG. 1A is a circuit diagram of a portion of a memory circuit, in accordance with one or more embodiments.

The following disclosure provides many different embodiments, or examples, for implementing different features of the invention. Specific examples of components and arrangements are described below to simplify the present disclosure. These are merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is related to a word line and/or bit line routing scheme usable to reduce word line resistance and, in at least some embodiments, to facilitate a faster operation. For example, in some technology nodes, the performance of a static random access memory (SRAM) circuit is limited by the resistance of word lines of the SRAM circuit. A memory circuit that comprises word lines according to one or more embodiments of the present disclosure has reduced word line resistance compared to a memory circuit having a different configuration. An operating frequency of the memory circuit is thus improved because of the reduced word line resistance.

Figure 1B:
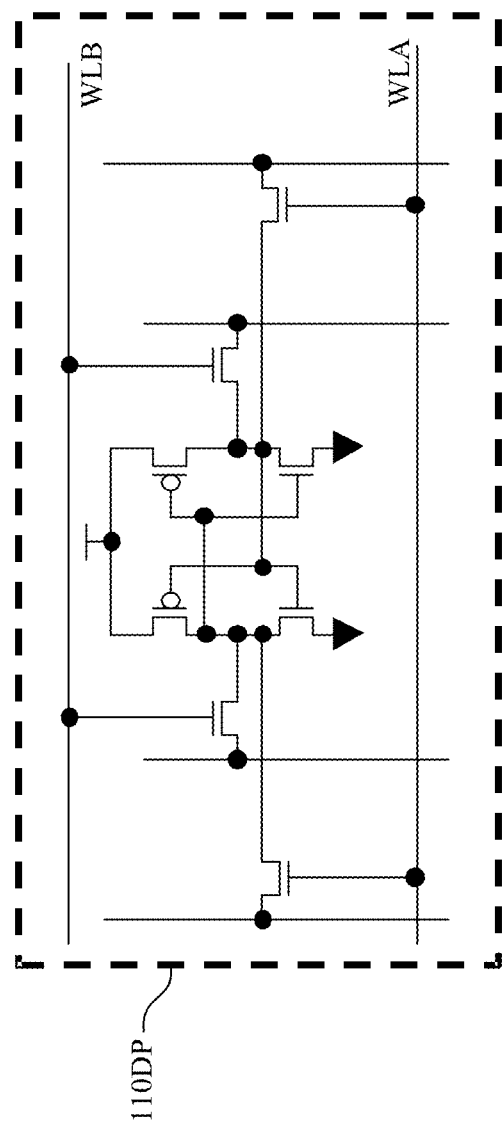
FIG. 1B is a circuit diagram of a dual port memory cell, in accordance with one or more embodiments.

FIG. 1A is a circuit diagram of a portion of a memory circuit 100 in accordance with one or more embodiments. Memory circuit 100 includes a plurality of memory cells arranged into columns and one or more pairs of adjacent rows. A pair of adjacent rows refers to two rows of memory cells without any intermediate row of memory cells therebetween. For example, memory circuit 100 includes memory cells 110A[0], 110B[0], and 110A[1], which belong to a column COL. Also, memory cell 110A[0] belongs to a first row ROW[0]; memory cell 110B[0] belongs to a second row ROW[1]; and memory cell 110A[1] belongs to a third row ROW[2]. In some embodiments, memory circuit 100 includes two or more columns of memory cells. In some embodiments, memory circuit 100 includes four or more rows of memory cells. Other memory cells in rows ROW[0], ROW[1], ROW[2], and ROW[3], which correspond to columns other than column COL, are not shown in FIG. 1.

Memory cells 110A[0], 110B[0], and 110A[1] are two-port-eight-transistor (2P-8T) SRAM cells. A two-port memory cell includes a write port and a read port. The read port includes a read data line that is configured to carry the data read from the memory cell through a read pass gate. The read pass gate is controlled by a read word line signal. The write port includes a write data line that is configured to carry the data to be written to the memory cell through one or more write pass gates. The one or more write pass gates are controlled by a write word line signal. In some embodiments, one or more of the memory cells 110 are dual-port SRAM cells such as memory cell 110DP (see FIG. 1B).

To reduce an area of the memory circuit 100 occupied by the memory cells 110, the word lines are arranged as close to one another as possible. Some design rules limit how close a first word line is allowed to be to a second word line in a memory cell 110 by establishing a minimum pitch at a predetermined value. To reduce the area of the memory circuit occupied by the memory cells 110 to a value approaching a minimum, while being in compliance with the minimum pitch, at least one memory cell 110 of the memory circuit 100 comprises a first word line such as WWLA[0] in a first layer on a first level of the memory circuit 100, and a second word line such as RWLA[0] having a first portion in the first layer and a second portion in a second layer of the memory circuit 100. In some embodiments, one or more word lines of adjacent memory cells 110 are split among different level of the memory circuit 100.

In some embodiments, both of the first word line and the second word line of a memory cell 110 are split among multiple levels of the memory circuit 100. In some embodiments, the first word line has a first portion in the first layer of the memory circuit 100, and a second portion in the second layer of the memory circuit 100 or in a third layer of the memory circuit 100. In other words, in some embodiments, the first word line and the second word line are split among multiple levels of the memory circuit, and the first word line and the second word line are split among a same or a different combination of levels of the memory circuit. In some embodiments, the first word line and/or the second word line are split among more than two levels of the memory circuit.

By arranging the word lines of a memory cell 110 such that one or more of the word lines are split among multiple levels of the memory circuit 100, the word lines of the memory cell 110 in a same layer are able to be effectively widened to avoid an increase in word line resistance as the area of the memory circuit 100 occupied by the memory cells 110 is reduced. The effective widening of the word lines by splitting the word line among multiple levels also makes it possible to reduce the area occupied by the memory cells 110 while keeping the layout of the word lines included in the memory cells 110 in compliance with the design rule that defines the minimum spacing between the word lines of the memory cells in the same layer.

Figure 2A:
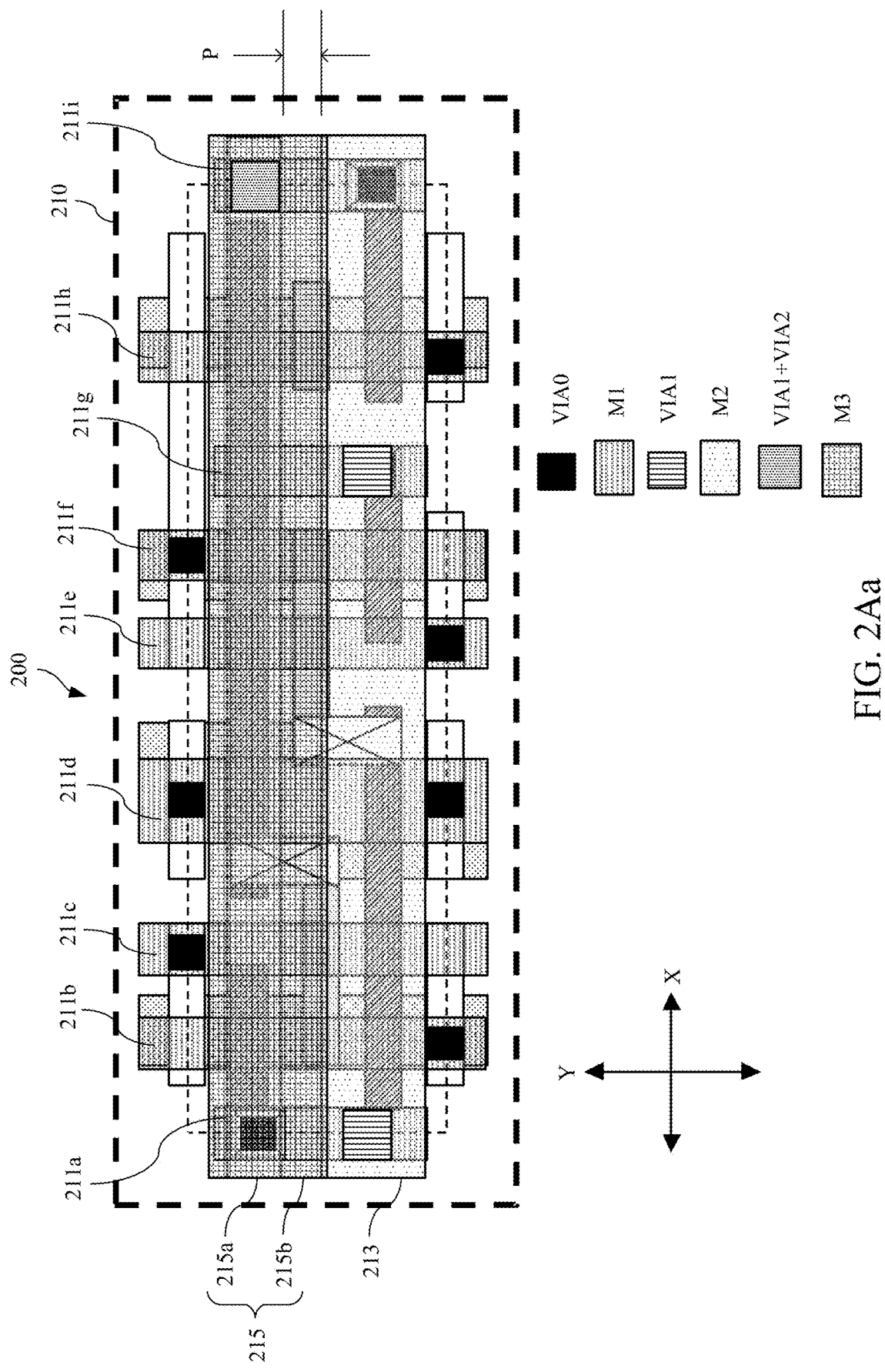
FIGS. 2Aa-2Ac are layout diagrams of a memory cell, in accordance with one or more embodiments.
Figure 2A:
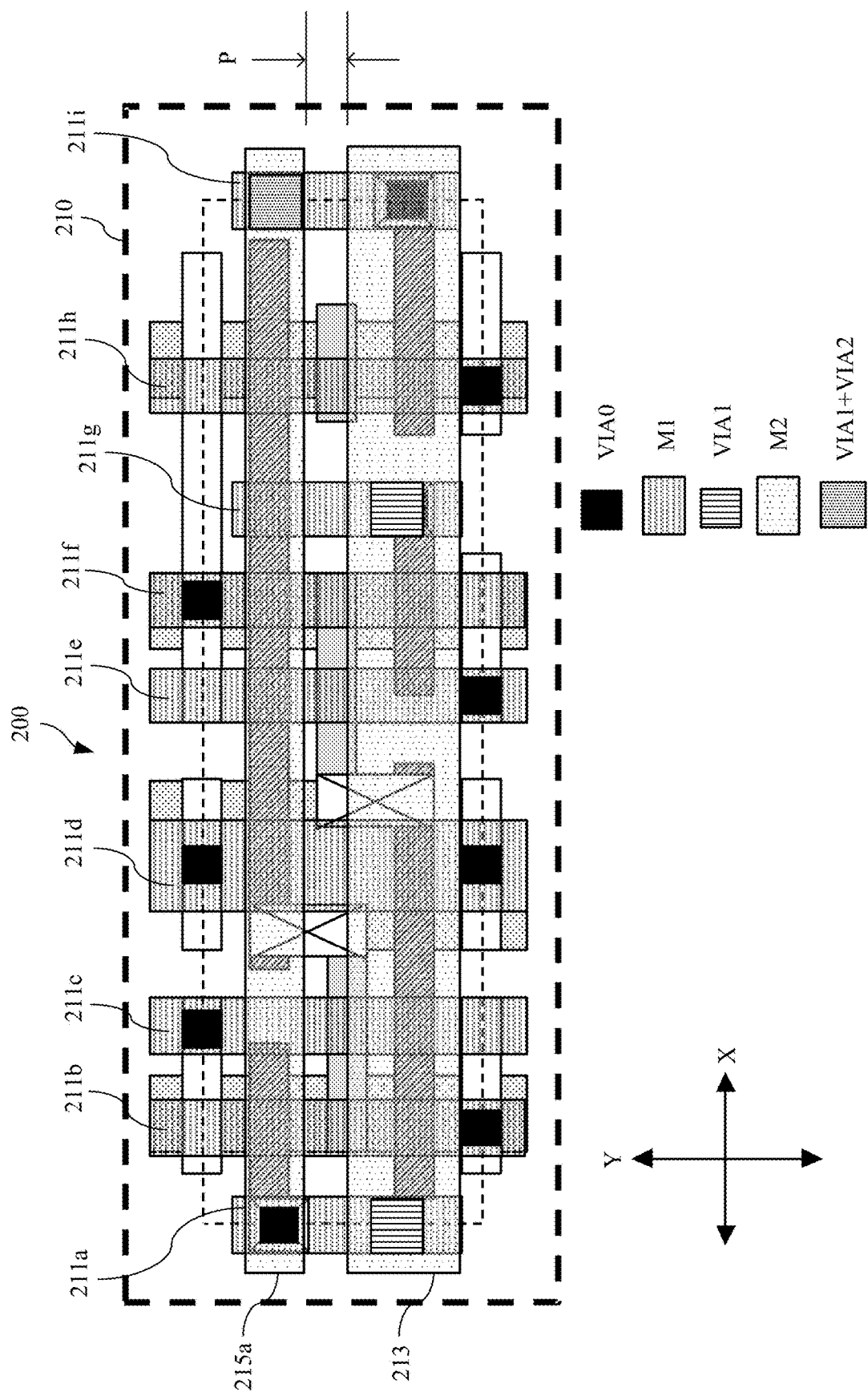
Figure 2A:
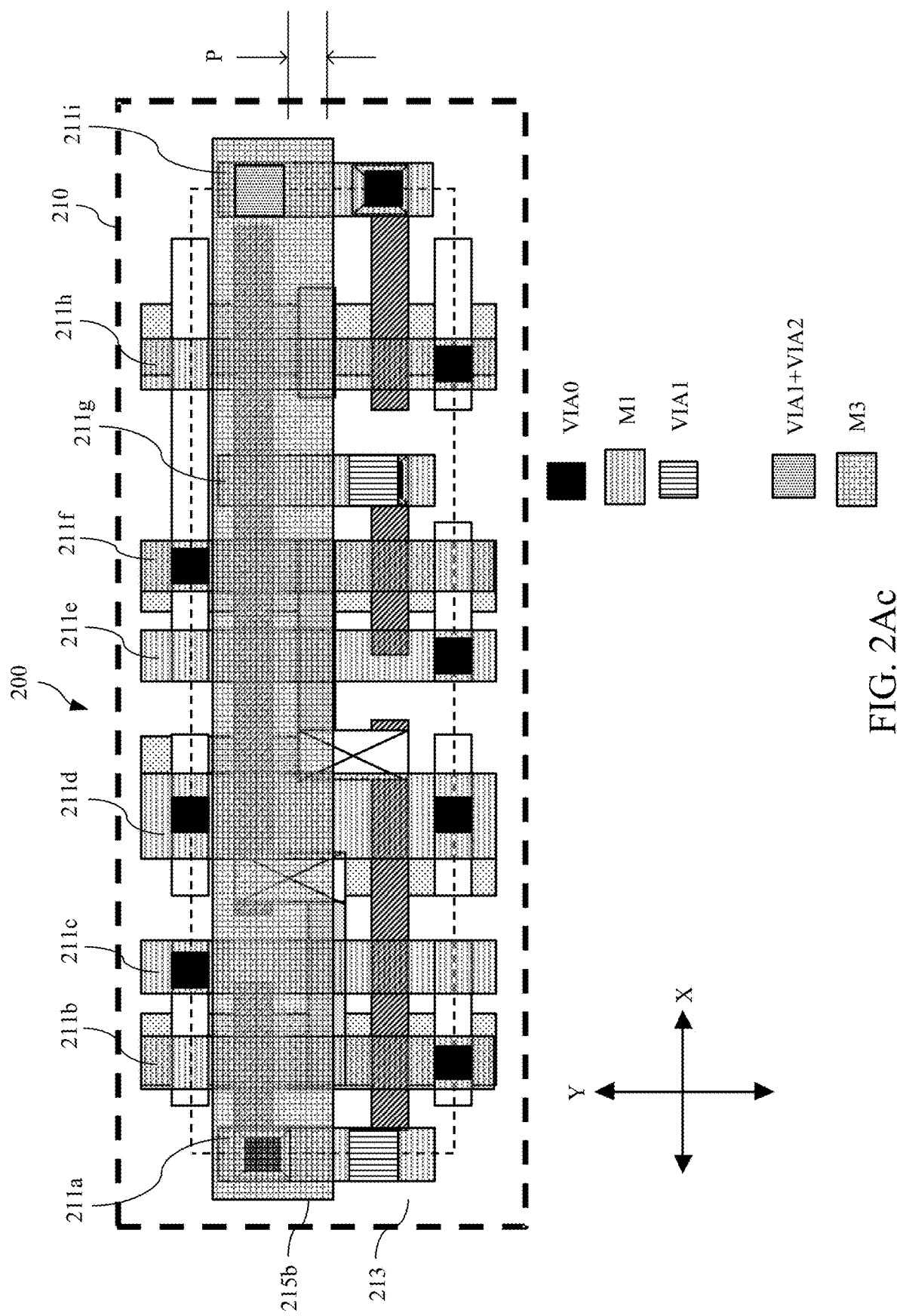
Figure 2A:
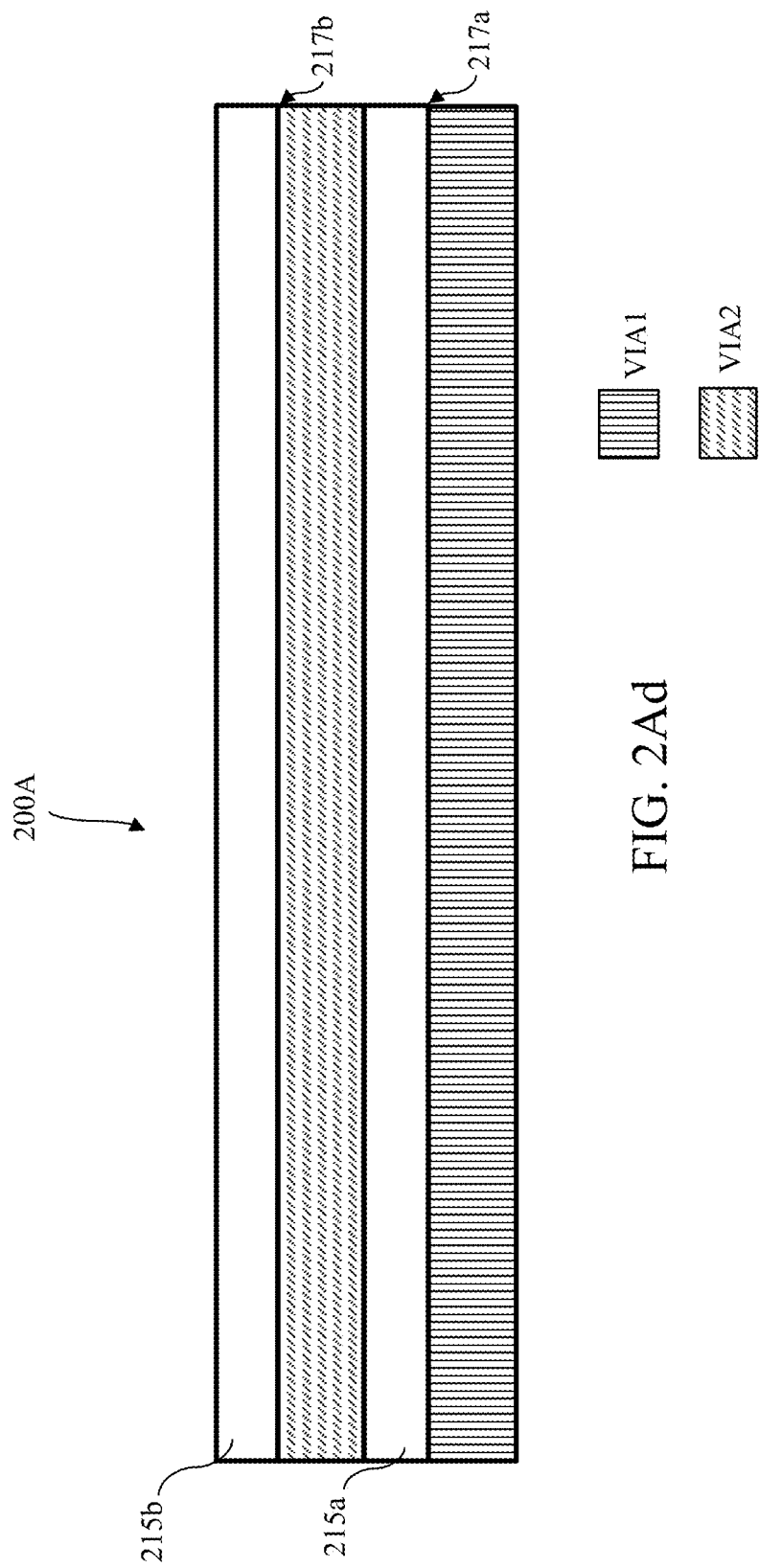

FIGS. 2Aa-2Ac show a layout diagram 200 of a memory cell 210, in accordance with one or more embodiments. The memory cell 210 in FIGS. 2Aa-2Ac is based on memory cell 110A[0] in FIG. 1A, and is usable to illustrate layout designs of one or more of memory cells 110A[0], 110B[0], 110A[1], or another memory cell 110 of the memory circuit 100 illustrated in FIG. 1A or 1B.

Memory cell 210 comprises a first via layer VIA0, a first conductive layer M1, a second via layer VIA1, a second conductive layer M2, a third via layer VIA2, and a third conductive layer M3. First conductive layer M1 is over first via layer VIA0, second via layer VIA1 is over first conductive layer M1, second conductive layer M2 is over second via layer VIA1, third via layer VIA2 is over second conductive layer M2, and third conductive layer M3 is over third via layer VIA2. Though the layers of memory cell 210 are discussed as having a certain arrangement, the layers of memory cell 210 can be arranged in any suitable order. For example, in some embodiments, the second conductive layer M2 is over the third conductive layer M3. In other embodiments, the first conductive layer M1 is over the second conductive layer M2.

The memory cell 210 includes conductive lines 211a-i (collectively referred to as conductive lines 211) routed in the first conductive layer M1. The conductive lines 211 have a width measured in a first direction X and a length measured in a second direction Y. The second direction Y is perpendicular to the first direction X. The length of each of the conductive lines 211 is greater than the width of each of the conductive lines such that the conductive lines 211 extend along the second direction Y. In some embodiments, at least one of the conductive lines 211 has a width that is greater than or equal to the length of the conductive line 211.

The memory cell 210 includes a first word line 213 and a second word line 215. The first word line 213 is a write word line. The second word line 215 is a read word line. In some embodiments, the first word line 213 is a read word and the second word line 215 is a write word line. The first word line 213 is routed in the second conductive layer M2, as shown in FIG. 2Ab. The second word line 215 has a first portion 215a routed in the second conductive layer M2, as shown in FIG. 2Ab, and a second portion 215b routed in the third conductive layer M3, as shown in FIG. 2Ac. The first word line 213 is separated from the first portion 215a of the second word line 215 in the second conductive layer M2 by at least a pitch P. In some embodiments, pitch P is a minimum value established by a set of design rules that establish how close the first word line 213 and the first portion 215a of the first word line 215 are allowed to be to one another in the second conductive layer M2 to be in compliance with the set of design rules associated with the layout 200 of the memory cell 210.

FIG. 2Ad is a cross-sectional view 200A of the first portion 215a and the second portion 215b of the second word line 215 illustrated in FIG. 2Aa, in accordance with one or more embodiments. The first portion 215a and the second portion 215b are split among multiple levels 217a and 217b. The first portion 215a is between via layer VIA1 and via layer VIA2.

The first word line 213 has a length measured in the first direction X and a width measured in the second direction Y. The length of the first word line 213 is greater than the width of the first word line 213 such that the first word line 213 extends along the first direction X. The first portion 215a of the second word line 215 has a length measured in the first direction X and a width measured in the second direction Y. The length of the first portion 215a of the second word line 215 is greater than the width of the first portion 215a of the second word line 215 such that the first portion 215a of the second word line 215 extends along the first direction X. The second portion 215b of the second word line 215 has a length measured in the first direction X and a width measured in the second direction Y. The length of the second portion 215b of the second word line 215 is greater than the width of the second portion 215b of the second word line 215 such that the second portion 215b of the second word line 215 extends along the first direction X.

The width of the first portion 215a of the second word line 215 is different from the width of the second portion 215b of the second word line 215. In the memory cell 210, the width of the second portion 215b of the second word line 215 is greater than the width of the first portion 215a of the second word line 215. In some embodiments, the second portion 215b of the second word line 215 is less than the width of the first portion 215a of the second word line 215. In other embodiments, the second portion 215b of the second word line 215 is equal to the width of the first portion 215a of the second word line 215.

The width of the first word line 213 is greater than the width of the first portion 215a of the second word line 215. In some embodiments, the width of the first word line 213 is equal to the width of the first portion 215a of the second word line 215. In other embodiments, the width of the first word line 213 is less than the width of the first portion 215a of the second word line 215.

Splitting the second word line 215 into the first portion 215a and the second portion 215b on different levels of the memory cell 210 makes it possible to reduce an area of the memory cell 210 occupied by the first word line 213 and the second word line 215 in the second conductive layer M2 without increasing the word line resistance. Normally, a reduction in the area occupied by the first word line 213 and the second word line 215 in the second conductive layer M2 would increase the word line resistance in one or both of the first word line 213 or the second word line 215, because the width of one or both of the first word line 213 or the second word line 215 would be decreased to reduce the area occupied. But, the effective width of the second word line 215 is the sum total of the width of the first portion 215a and the second portion 215b of the second word line 215. Splitting the second word line 215 into the first portion 215a and the second portion 215b enables at least the width of the first portion 215a of the second word line 215 to be minimized while maintaining or increasing the effective width of the second word line 215 overall.

Even though the area of the second conductive layer M2 occupied by the first word line 213 and the second word line 215 is reduced, the minimum pitch P between the first word line 213 and the first portion 215a of the second word line 215 is maintained. As such, in some embodiments, it is possible to increase the width of the first word line 213 to value that is greater than or equal to the sum total of the width of the first portion 215a and the second portion 215b of the second word line 215, resulting in a memory cell 210 that has an area occupied by the first word line 213 and the second word line 215 that is less than another memory cell 210 in which the total effective width of the second word line 215 and the first word line 213 were in the same second conductive layer M2.

The first conductive layer M1 is coupled with the first via layer VIA0 and the second via layer VIA1. The second conductive layer M2 is coupled with the second via layer VIAL As such, the first conductive layer M1 is coupled with the second conductive layer M2 by way of second via layer VIA1.

The second conductive layer M2 is coupled with the third via layer VIA2. The third conductive layer M3 is coupled with the third via layer VIA2. As such, the second conductive layer M2 is coupled with the third conductive layer M3 by way of the third via layer VIA2. Accordingly, the first portion 215a of the second word line 215 is coupled with the second portion 215b of the second word line 215 by way of third via layer VIA2.

The first conductive layer M1, the second conductive layer M2, the third conductive layer M3, the first via layer VIA0, the second via layer VIA1, and the third via layer VIA2 comprise one or more conductive materials such as gold, copper, aluminum, tungsten, silicon, polysilicon, silicide, or other suitable material. In some embodiments, one or more of the first conductive layer M1, the second conductive layer M2, the third conductive layer M3, the first via layer VIA0, the second via layer VIA1, and the third via layer VIA2 comprise the same material or combination of materials. In some embodiments, the first word line 213 comprises a first conductive material, the first portion 215a of the second word line 215 comprises the first conductive material, and the second portion 215b of the second word line 215 comprises a second conductive material, and the first conductive material is different from the second conductive material.

Figure 2B:
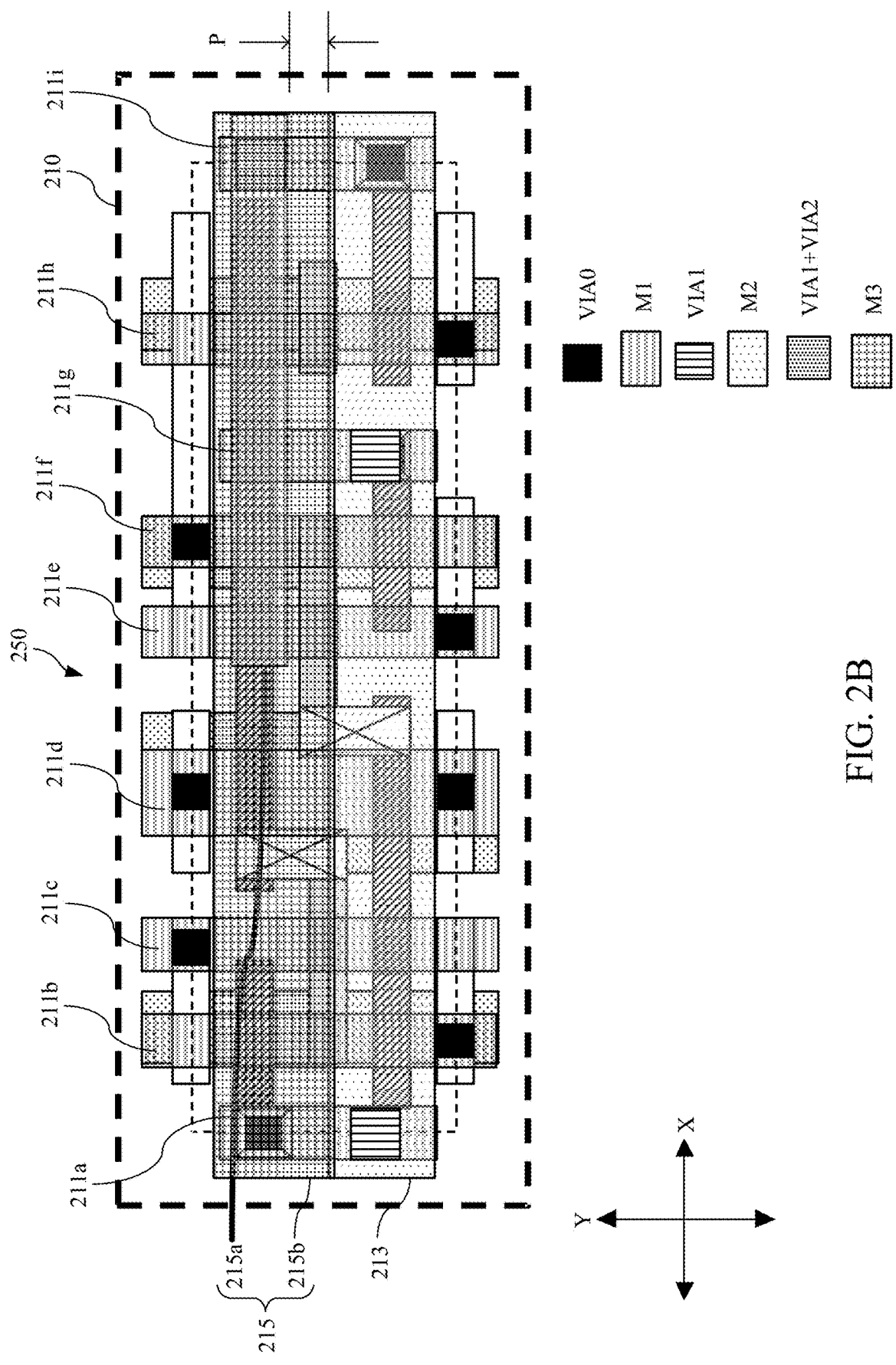
FIG. 2B is a layout diagram of a memory cell, in accordance with one or more embodiments.

FIG. 2B is a layout diagram 250 of a memory cell 210, in accordance with one or more embodiments. The memory cell 210 in FIG. 2B is based on memory cell 110A[0] in FIG. 1A, and is usable to illustrate layout designs of one or more of memory cells 110A[0], 110B[0], 110A[1], or another memory cell 110 of the memory circuit 100 illustrated in FIG. 1A or 1B. The memory cell 210 in FIG. 2B comprises many of the features included in layout diagram 200 (FIGS. 2Aa-2Ac). In layout diagram 250, the second word line 215 includes first portion 215a that is shorter in length along the first direction X compared to the first word line 213. The shorter length of the first portion 215a of the second word line 215 results in the second word line 215 being coupled with a different set of conductive lines 211 (i.e., conductive lines 211e-211i, in this example embodiment), compared to the conductive lines 211 that the first word line 213 is coupled with (i.e., conductive lines 211a-211i, in this example embodiment). The second portion 215b of the second word line 215, in this example embodiment, has a length along the first direction X that is greater than the length of the first portion 215a of the second word line 215. In some embodiments, the second portion 215b of the second word line has an equal length to the first portion 215a of the second word line. The second portion 215b of the second word line 215, in this example embodiment, has a length along the first direction X that is equal to the length of the first word line 213. In some embodiments, one or more of the first portion 215a or the second portion 215b of the second word line 215 have a length along the first direction X that is different from a length of the first word line 213 along the first direction X.

In some embodiments, as more than one memory cell 210 are arranged in a memory circuit such as memory circuit 100 (FIG. 1A) in adjacent columns, first portion 215a (if shorter than first word line 213, for example) results in a plurality of second word line 215 islands in the first portion 215a of the second word line 215. For example, as adjacent memory cells 210 are stacked against one another in adjacent columns of memory circuit 100, the first portion 215a is discontinuous between one memory cell 210 and a next memory cell 210. In some embodiments, the first portion 215a of the second word line 215 is divided into multiple segmented islands within one memory cell 210.

In some embodiments, the second portion 215b of the second word line 215 is continuous among adjacent memory cells 210. In other embodiments, the second portion 215b of the second word line 215 is discontinuous between adjacent memory cells 210. In some embodiments, the second portion 215b of the second word line 215 is divided into multiple segmented islands within one memory cell 210. In some embodiments, only one of the first portion 215a or the second portion 215b of the second word line 215 is discontinuous among adjacent memory cells 210 or within one memory cell 210 in a memory circuit 100. In other embodiments, both of the first portion 215a and the second portion 215b are discontinuous among adjacent memory cells 210 and/or within one memory cell 210 of memory circuit 100. Similarly, in some embodiments, the first word line 213 is discontinuous among adjacent memory cells 210 of memory circuit 100. In some embodiments, the first word line 213 is discontinuous within one memory cell 210, resulting in multiple segmented first word line 213 islands within the single memory cell 210.

Figure 3:
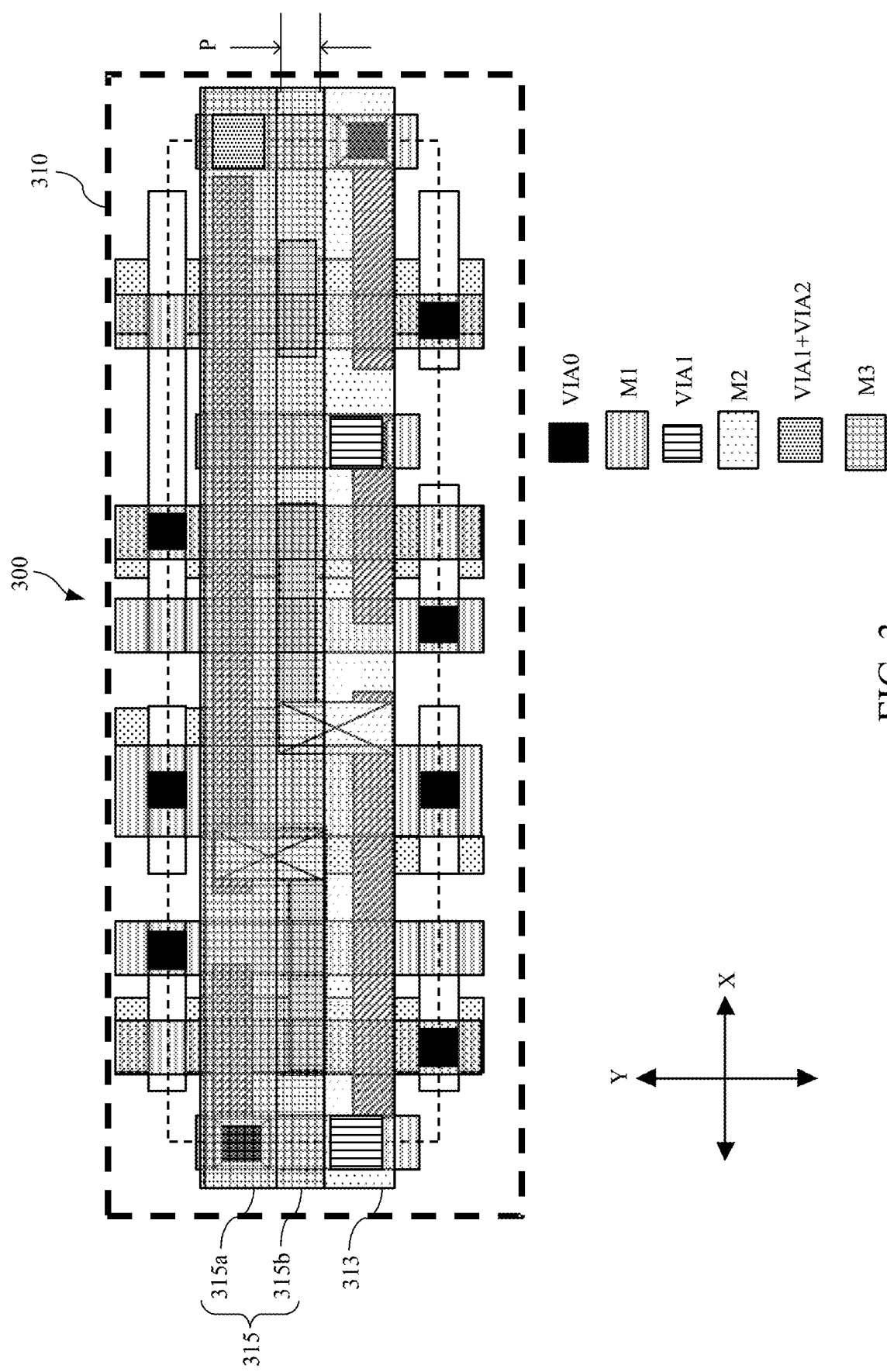
FIG. 3 is a layout diagram of a memory cell, in accordance with one or more embodiments.

FIG. 3 is a layout diagram 300 of a memory cell 310, in accordance with one or more embodiments. The memory cell 310 in FIG. 3 is based on memory cell 110A[0] in FIG. 1A, and is usable to illustrate layout designs of memory cells 110A[0], 110B[0], 110A[1], or another memory cell 110 of the memory circuit 100 illustrated in FIG. 1A or 1B. Memory cell 310 includes many of the features discussed with respect to memory cell 210 (FIGS. 2Aa-2Ac), with the reference numerals increased by 100.

In memory cell 310, the width of the first word line 313 is equal to the width of the first portion 315a of the second word line 315 in the second conductive layer M2. The first word line 313 is separated from the first portion 315a of the second word line 315a by the pitch P. The second portion 315b of the second word line 315 is in the third conductive layer M3 and coupled with the first portion 315a of the first word line 315 by the third via layer VIA2. The effective width of the second word line 315 is greater than the width of the first word line 313, because the effective width of the second word line is the sum total of the widths of the first portion 315a of the second word line 315 and the second portion 315b of the second word line 315.

If the second word line 315 in this example is a write word line, then the memory cell 310 would be capable of achieving faster write speeds than read speeds, because the second word line 315 would have a lower resistance than the first word line on account of having a greater effective line width. Similarly, if the second word line 315 is a read word line, the memory cell 310 would be capable of achieving faster read speeds than write speeds.

Figure 4:
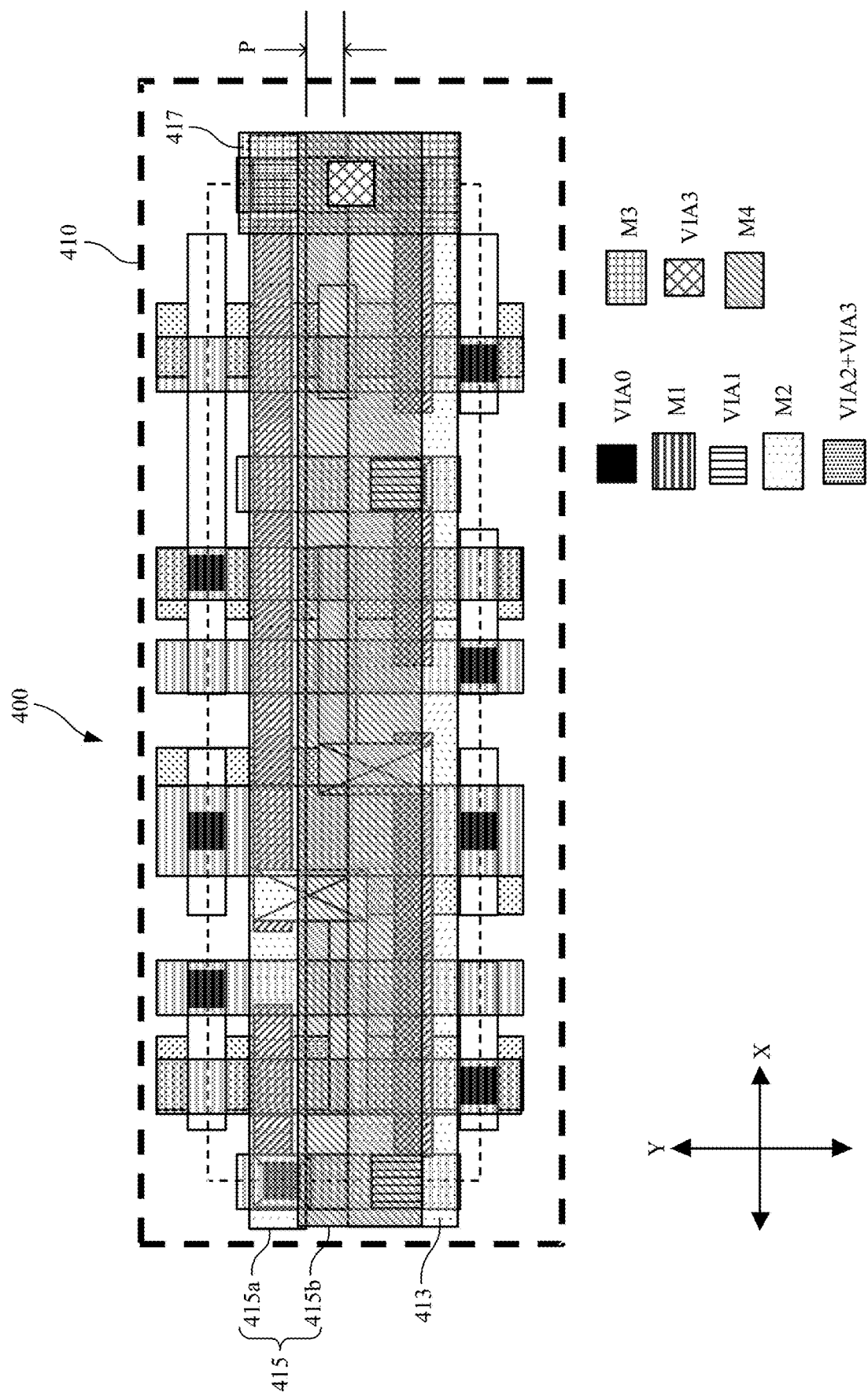
FIG. 4 is a layout diagram of a memory cell, in accordance with one or more embodiments.

FIG. 4 is a layout diagram 400 of a memory cell 410, in accordance with one or more embodiments. The memory cell 410 in FIG. 4 is based on memory cell 110A[0] in FIG. 1A, and is usable to illustrate layout designs of memory cells 110A[0], 110B[0], 110A[1], or another memory cell 110 of the memory circuit 100 illustrated in FIG. 1A or 1B. Memory cell 410 includes many of the features discussed with respect to memory cell 210 (FIGS. 2Aa-2Ac), with the reference numerals increased by 200.

Memory cell 410 comprises a first via layer VIA0, a first conductive layer M1, a second via layer VIA1, a second conductive layer M2, a third via layer VIA2, a third conductive layer M3, a fourth via layer VIA3, and a fourth conductive layer M4. First conductive layer M1 is over first via layer VIA0, second via layer VIA1 is over first conductive layer M1, second conductive layer M2 is over second via layer VIA1, third via layer VIA2 is over second conductive layer M2, third conductive layer M3 is over third via layer VIA2, fourth via layer VIA3 is over third conductive layer M3, and fourth conductive layer M4 is over fourth via layer VIA3.

In memory cell 410, the first word line 413 is routed in the second conductive layer M2, the first portion 415a of the second word line 415 is routed in the first conductive layer M2, and the second portion 415b of the second word line 415 is routed in the fourth conductive layer M4.

The first conductive layer M1 is coupled with the first via layer VIA0 and the second via layer VIA1. The second conductive layer M2 is coupled with the second via layer VIA1. As such, the first conductive layer M1 is coupled with the second conductive layer M2 by way of second via layer VIA1.

The second conductive layer M2 is coupled with the third via layer VIA2. The third conductive layer M3 is coupled with the third via layer VIA2. As such, the second conductive layer M2 is coupled with the third conductive layer M3 by way of the third via layer VIA2. The third conductive layer M3 is coupled with the fourth via layer VIA3. The fourth conductive layer is coupled with the fourth via layer VIA3. Accordingly, the first portion 415a of the second word line 415 is coupled with the second portion 415b of the second word line 415 by way of third via layer VIA2, the third conductive layer M3, and the fourth via layer VIA3.

The first conductive layer M1, the second conductive layer M2, the third conductive layer M3, the fourth conductive layer M4, the first via layer VIA0, the second via layer VIA1, the third via layer VIA2, and the fourth via layer VIA3 comprise one or more conductive materials such as gold, copper, aluminum, tungsten, silicon, polysilicon, silicide, or other suitable material. In some embodiments, one or more of the first conductive layer M1, the second conductive layer M2, the third conductive layer M3, the fourth conductive layer M4, the first via layer VIA0, the second via layer VIA1, the third via layer VIA2, or the fourth via layer VIA3 comprise the same material or combination of materials. In some embodiments, the first word line 213 comprises a first conductive material, the first portion 215a of the second word line 215 comprises the first conductive material, and the second portion 215b of the second word line 215 comprises a second conductive material, and the first conductive material is different from the second conductive material.

The first portion 415a of the second word line 415 extends along the first direction X, the second portion 415b of the second word line 415 extends along the first direction X, and the first portion 415a of the second word line 415 is offset from the second portion 415b of the second word line 415 by a distance in the second direction Y such that the first portion 415a of the second word line 415 and the second portion 415b of the second word line do not overlap one another. In some embodiments, the first portion 415a of the second word line 415 and the second portion 415b of the second word line 415 overlap one another.

The memory cell 410 includes a conductive line 417 routed in the third conductive layer M3. The conductive line 417 has a width measured in the first direction X and a length measured in the second direction Y. The length of the conductive line 417 is greater than the width such that the conductive line 417 extends in the second direction Y. In some embodiments, the width of the conductive line 417 is greater than or equal to the length. Because the conductive line 417 has a length extending in the second direction Y, the first portion 415a of the second word line 415 is coupled with the second portion 415b of the second word line 415 by way of the conductive line 417 in situations where the first portion 415a of the second word line 415 and the second portion 415b of the second word line 415 do not overlap and/or in situations where the third via layer VIA2 and the fourth via layer VIA3 do not overlap one another.

Figure 5:
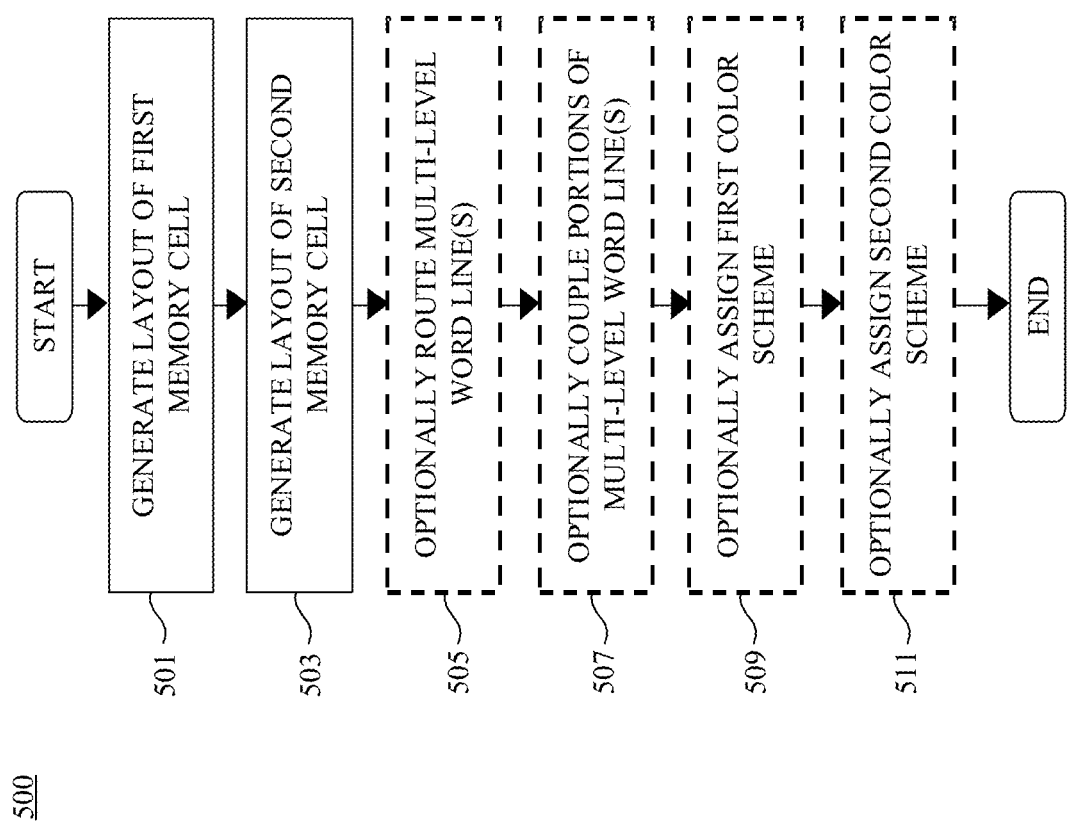
FIG. 5 is a flowchart of a method of designing a memory circuit, in accordance with one or more embodiments.

FIG. 5 is a flowchart of a method 500 of designing a memory circuit, in accordance with one or more embodiments. The method 500 is performed by execution of an electronic design automation (EDA) tool implemented by an integrated circuit design system comprising a processor such as processor 703 (FIG. 7) executing a set of instructions.

Method 500 begins with step 501 in which execution of the EDA tool causes a layout of a first memory cell to be generated. For example, if a memory circuit such as memory cell 100 (FIG. 1A) is being designed, a layout of a first memory cell 110B[0] is generated. The layout of the first memory cell is generated by routing a first word line such as RWLB[0] in a first layer on a first level of the memory circuit, and routing a second word line such as WWLB[0] in the first layer of the memory circuit.

In step 503, execution of the EDA tool causes a layout of a second memory cell to be generated. For example, if a memory circuit such as memory circuit 100 is being designed, a layout of a second memory cell 110A[1] is generated by routing a third word line such as RWLA[1] in the first layer, and routing a fourth word line such as WWLA[1] in the first layer. The second word line is routed between the first word line and the third word line. The third word line is routed between the second word line and the fourth word line. Even though the first word line is described as being a read word line, the second word line is described as being a write word line, the third word line is described as being a read word line, and the fourth word line is described as being a write word line, the memory circuit is capable of having the types of word lines (i.e., read or write) arranged in any order.

In some embodiments, one or more of the first memory cell or the second memory cell is designed having at least one multi-level word line such as word line 215 (FIGS. 2Aa-2Ac). If, for example, the second word line is designed as a multi-level word line, then the method proceeds to optional step 505 in which execution of the EDA tool causes the second word line to be routed in the first layer, as well as in a second layer of the memory circuit. If neither of the first memory cell or the second memory cell comprises multi-level word lines, then the method proceeds to optional step 509 or the method ends.

If the method proceeds to optional step 505, then the second word line routed in step 501 is considered to correspond to the first portion of the second word line, and the execution of the EDA tool causes the second portion of the second word line to be routed in the second layer of the memory circuit.

The method proceeds to optional step 507 in which execution of the EDA tool causes the first portion of the second word line to be coupled with the second portion of the second word line using a via layer such as VIA[1] (FIGS. 2Aa-2Ac). In some embodiments, other via layers or intermediary layers such as via VIA[2] (FIG. 4) and/or conductive layer M3 of FIG. 4 are used to couple the first portion of the second word line with the second portion of the second word line. The method optionally proceeds to step 509, or the method ends.

In optional step 509, execution of the EDA tool causes a first color scheme to be assigned to the first word line and to the third word line in the layout. In optional step 511, execution of the EDA tool causes a second color scheme to be assigned to the second word line and to the fourth word line in the layout. The first color scheme is associated with a first manufacturing process that uses a first mask for forming the memory circuit. The second color scheme is associated with a second manufacturing process that uses a second mask for forming the memory circuit.

In some embodiments, the color scheme assigned to the first word line and the third word line is limited to word line portions of the first word line and the third word line routed in a same layer of the memory circuit. In some embodiments, the color scheme assigned to the second word line and the fourth word line is limited to word line portions of the second word line and the fourth word line routed in a same layer of the memory circuit. For example, if one or more of the first word line and the third word line are multi-level word lines, execution of the EDA tool causes portions of the first word line and the third word line routed in the first layer to be assigned to have the same color scheme, while portions of the first word line and the third word line in another layer of the memory circuit would optionally be assigned to have the same or different color schemes.

Figure 6:
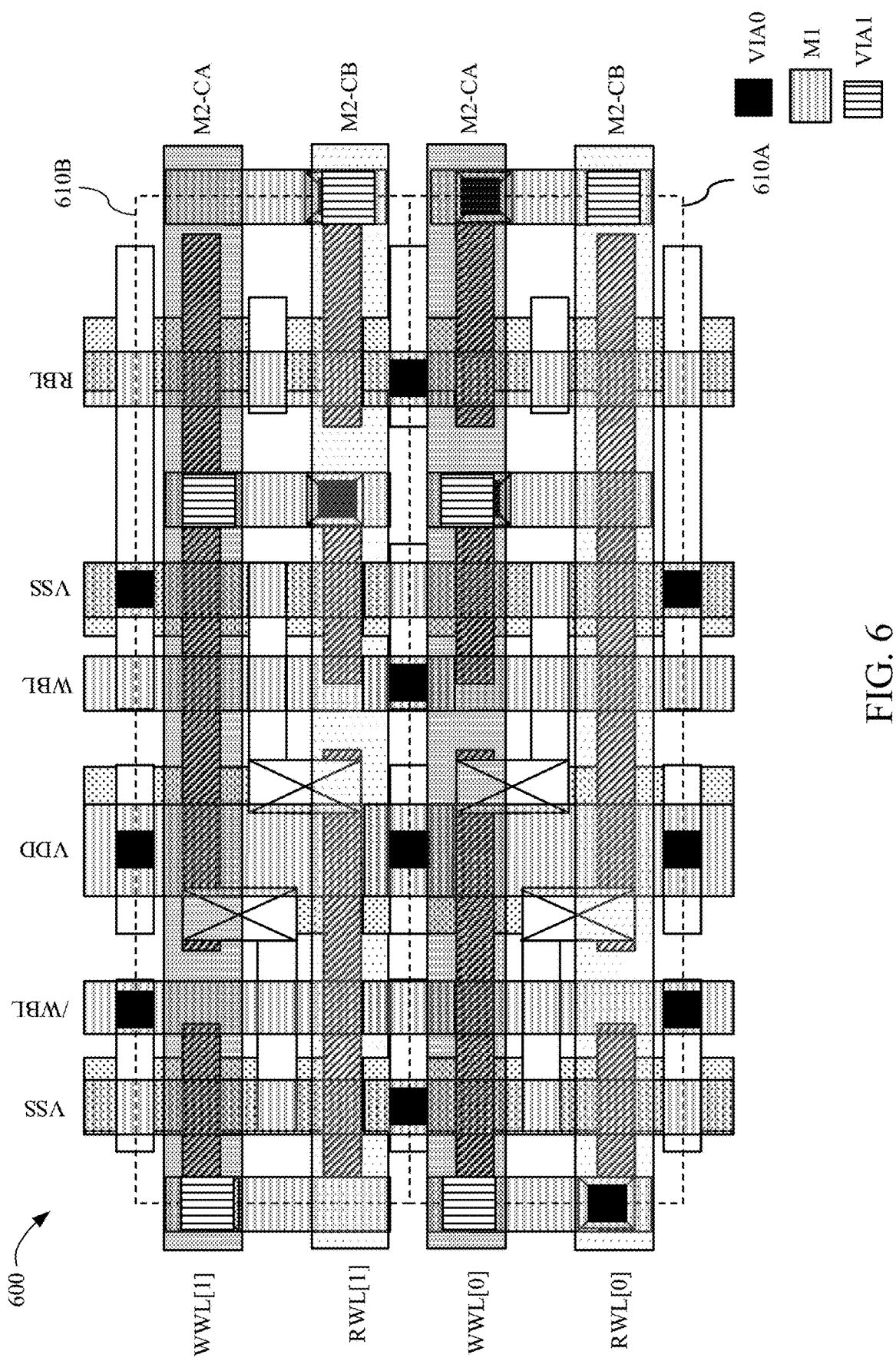
FIG. 6 is a layout diagram of a portion of a memory circuit, in accordance with one or more embodiments.

Manufacturing processes that use different masks sometimes cause variations in line widths between lines formed using a first mask and lines formed using a second mask. As such, using a first mask for read word lines and a second mask for write word lines prevents line width discrepancies between a read word line in the first memory cell and a read word line in the second memory cell. Similarly, using a first mask for read word lines and a second mask for write word lines prevents line width discrepancies between a write word line in the first memory cell and a write word line in the second memory cell. Having consistent read word line widths between memory cells in a memory circuit prevents discrepancies between read speed capabilities of a first memory cell and a second memory cell. Similarly consistent write word line widths between memory cells in a memory circuit minimizes discrepancies between write speed capabilities of a first memory cell and a second memory cell FIG. 6 a layout diagram 600 of adjacent memory cells of a memory circuit designed using method 500 of FIG. 5, in accordance with one or more embodiments. The first memory cell 610A and the second memory cell 610B in FIG. 6 are based on memory cells 110A[0], 110B[0], 110A[1], or another memory cell 110 of the memory circuit 100 illustrated in FIG. 1A or 1B. Memory cells 610A and 610B include many of the features discussed with respect to memory cell 210 (FIGS. 2Aa-2Ac), with the reference numerals increased by 400.

The layout diagram 600 is a representation of the word lines, or at least portions of the word lines, included in the same layer of a memory circuit having first memory cell 610A and second memory cell 610B. A first word line RWL[0] of the first memory cell 610A and a second word line WWL[0] of the first memory cell 610A are routed in the second conductive layer M2 of the memory circuit. The first word line RWL[0] is assigned a first color scheme CB, and the second word line WWL[0] is assigned a second color scheme CA. A third word line RWL[1] of the second memory cell 610B and a fourth word line WWL[1] of the second memory cell 610B are routed in the second conductive layer M2 of the memory circuit. The third word line RWL[1] is assigned the first color scheme CB, and the fourth word line WWL[1] is assigned a second color scheme CA. The assigned color schemes enable a circuit designer to visually distinguish, by way of a graphical user interface associated with the EDA tool, between word lines that are designed to be manufactured using a first mask process and word lines that are designed to be manufactured using a second mask process.

The processes described herein for designing a memory circuit may be advantageously implemented via software in combination with hardware or firmware, hardware, firmware or a combination of software and firmware and/or hardware. For example, the processes described herein, may be advantageously implemented via a processor, Digital Signal Processing (DSP) chip, an Application Specific Integrated Circuit (ASIC), Field Programmable Gate Arrays FPGAs, etc. Such exemplary hardware for performing the described functions is detailed below.

FIG. 7 is a functional block diagram of a computer or processor-based system 700 upon which or by which an embodiment is implemented.

Processor-based system 700 is programmed to design a memory circuit, as described herein, and includes, for example, bus 701, processor 703, and memory 705 components.

In some embodiments, the processor-based system is implemented as a single "system on a chip." Processor-based system 700, or a portion thereof, constitutes a mechanism for designing a memory circuit. In some embodiments, the processor-based system 700 includes a communication mechanism such as bus 701 for transferring information and/or instructions among the components of the processor-based system 700. Processor 703 is connected to the bus 701 to obtain instructions for execution and process information stored in, for example, the memory 705. In some embodiments, the processor 703 is also accompanied with one or more specialized components to perform certain processing functions and tasks such as one or more digital signal processors (DSP), or one or more application-specific integrated circuits (ASIC). A DSP typically is configured to process real-world signals (e.g., sound) in real time independently of the processor 703. Similarly, an ASIC is configurable to perform specialized functions not easily performed by a more general purpose processor. Other specialized components to aid in performing the functions described herein optionally include one or more field programmable gate arrays (FPGA), one or more controllers, or one or more other special-purpose computer chips.

In one or more embodiments, the processor (or multiple processors) 703 performs a set of operations on information as specified by a set of instructions stored in memory 705 related to designing a memory circuit. The execution of the instructions causes the processor to perform specified functions.

The processor 703 and accompanying components are connected to the memory 705 via the bus 701. The memory 705 includes one or more of dynamic memory (e.g., RAM, magnetic disk, writable optical disk, etc.) and static memory (e.g., ROM, CD-ROM, etc.) for storing executable instructions that when executed perform the steps described herein to design a memory circuit. The memory 705 also stores the data associated with or generated by the execution of the steps.

In one or more embodiments, the memory 705, such as a random access memory (RAM) or any other dynamic storage device, stores information including processor instructions for designing a memory circuit. Dynamic memory allows information stored therein to be changed. RAM allows a unit of information stored at a location called a memory address to be stored and retrieved independently of information at neighboring addresses. The memory 705 is also used by the processor 703 to store temporary values during execution of processor instructions. In various embodiments, the memory 705 is a read only memory (ROM) or any other static storage device coupled to the bus 701 for storing static information, including instructions, that is not changed. Some memory is composed of volatile storage that loses the information stored thereon when power is lost. In some embodiments, the memory 705 is a non-volatile (persistent) storage device, such as a magnetic disk, optical disk or flash card, for storing information, including instructions, that persists even when power supplied to the memory 705 is turned off.

The term "computer-readable medium" as used herein refers to any medium that participates in providing information to processor 703, including instructions for execution. Such a medium takes many forms, including, but not limited to computer-readable storage medium (e.g., non-volatile media, volatile media). Non-volatile media includes, for example, optical or magnetic disks. Volatile media include, for example, dynamic memory. Common forms of computer-readable media include, for example, a floppy disk, a flexible disk, a hard disk, a magnetic tape, another magnetic medium, a CD-ROM, CDRW, DVD, another optical medium, punch cards, paper tape, optical mark sheets, another physical medium with patterns of holes or other optically recognizable indicia, a RAM, a PROM, an EPROM, a FLASH-EPROM, an EEPROM, a flash memory, another memory chip or cartridge, or another medium from which a computer can read. The term computer-readable storage medium is used herein to refer to a computer-readable medium.

An aspect of this description relates to a method of designing a memory circuit. The method includes generating a layout of a first memory cell using an integrated circuit design system. The layout of the first memory cell is generated by routing a first word line in a first layer on a first level, and routing a second word line in the first layer. Also, the method includes generating a layout of a second memory cell using the integrated circuit design system. The layout of the second memory cell is generated by routing a third word line in the first layer, the second word line being between the first word line and the third word line, and routing a fourth word line in the first layer, the third word line being between the second word line and the fourth word line. Moreover, the method includes assigning a first color scheme to the first word line and to the third word line, and assigning a second color scheme to the second word line and to the fourth word line. The first color scheme is associated with a first manufacturing process using a first mask and the second color scheme is associated with a second manufacturing process using a second mask.

Another aspect of this description relates to a method of generating a layout of a memory circuit. The method includes routing a first word line in a first layer, and routing a first portion of a second word line in the first layer. Also, the method includes routing a second portion of the second word line in a second layer, and separating the first word line from the first portion of the second word line, and separating the first portion and second portion of the second word line to different memory levels to reduce an area occupied by the first word line and second word line.

A further aspect of this description relates to a method of generating a layout of a memory circuit, the method. The method includes routing a first word line in a first layer, and routing a first portion of a second word line in the first layer. Also, the method includes routing a second portion of the second word line in a second layer, and extending long axes of the first and second portions of the second word line in a first direction. Moreover, the method includes positioning the first portion of the second word line to be offset from the second portion of the second word line in a second direction, and the second direction being perpendicular to the first direction The first direction of the second portion of the second word line comprises a length greater than a width in a second direction of the second portion of the second word line. The second direction is substantially perpendicular to the first direction.

The foregoing outlines features of several embodiments so that those of ordinary skill in the art may better understand the aspects of the present disclosure. Those of ordinary skill in the art should appreciate that they may readily use the present disclosure as a basis for designing or modifying other circuits, processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method of designing a memory circuit, the method comprising:
    generating a layout of a first memory cell using an integrated circuit design system, the layout of the first memory cell being generated by:
        routing a first word line in a first layer on a first level; and
        routing a second word line in the first layer;
    generating a layout of a second memory cell using the integrated circuit design system, the layout of the second memory cell being generated by:
        routing a third word line in the first layer, the second word line being between the first word line and the third word line; and
        routing a fourth word line in the first layer, the third word line being between the second word line and the fourth word line;
    assigning a first color scheme to the first word line and to the third word line; and
    assigning a second color scheme to the second word line and to the fourth word line,
        wherein the first color scheme is associated with a first manufacturing process using a first mask and the second color scheme is associated with a second manufacturing process using a second mask.

2. The method of claim 1, wherein the first word line is a read word line, the second word line is a write word line, the third word line is a read word line, and the fourth word line is a write word line.

3. The method of claim 1, wherein the second word line comprises a first portion in the first layer and a second portion in a second layer, and the method further comprises:
    routing the second portion of the second word line in the second layer, the second layer being on a second level different from the first level; and
    coupling the first portion of the second word line with the second portion of the second word line with a via layer.

4. The method of claim 3, wherein the first portion of the second word line has a first width, the second portion of the second word line has a second width, and the first width is different from the second width.

5. The method of claim 4, wherein the second width is greater than the first width.

6. The method of claim 3, wherein the first portion of the second word line has a first width, the second portion of the second word line has a second width, and the first word line has a third width different from the first width.

7. The method of claim 3, wherein the first portion of the second word line has a first width, the second portion of the second word line has a second width, and the first word line has a third width equal to the first width.

8. A method of generating a layout of a memory circuit, the method comprising:
    routing a first word line in a first layer;
    routing a first portion of a second word line in the first layer;
    routing a second portion of the second word line in a second layer;
    separating the first word line from the first portion of the second word line; and
    separating the first portion and second portion of the second word line to different memory levels to reduce an area occupied by the first word line and second word line.

9. The method of claim 8, wherein the routing the first word line includes the first word line comprising a first conductive material, the first portion of the second word line comprising the first conductive material, and the second portion of the second word line comprising a second conductive material.

10. The method of claim 9, wherein the routing the first word line includes the first conductive material being different from the second conductive material.

11. The method of claim 8, wherein the routing the first portion of the second word line includes extending each of the first word line and the first and second portions of the second word line in a first direction.

12. The method of claim 11, wherein the routing the first portion of the second word line includes routing the first word line to have a length in the first direction greater than a width in a second direction of the first portion of the second word line.

13. The method of claim 11, wherein the routing the second portion of the second word line includes routing the first and second portions of the second word line to have substantially equal lengths.

14. A method of generating a layout of a memory circuit, the method comprising:
    routing a first word line in a first layer;
    routing a first portion of a second word line in the first layer;
    routing a second portion of the second word line in a second layer;
    extending long axes of the first and second portions of the second word line in a first direction; and
    positioning the first portion of the second word line to be offset from the second portion of the second word line in a second direction, and the second direction being perpendicular to the first direction, wherein the first direction of the second portion of the second word line comprises a length greater than a width in a second direction of the second portion of the second word line, the second direction being substantially perpendicular to the first direction.

15. The method of claim 14, wherein the method further comprises coupling the first portion of the second word line with the second portion of the second word line by a first via layer.

16. The method of claim 15, wherein the coupling of the first portion of the second word line with the second portion of the second word line includes extending a conductive line in the second direction and coupled with the first via layer by way of a third layer.

17. The method of claim 16, wherein the coupling of the first portion of the second word line with the second portion of the second word line includes coupling the conductive line with the second portion of the second word line.

18. The method of claim 14, wherein the routing the second portion of the second word line includes positioning the first layer and the second layer on different levels.

19. The method of claim 14, wherein the positioning the first portion of the second word line to be offset from the second portion includes a width in the second direction of the first portion of the second word line being different from the width in the second direction of the second portion of the second word line.

20. The method of claim 19, wherein the positioning the first portion of the second word line to be offset from the second portion includes the width in the second direction of the second portion of the second word line being greater than the width in the second direction of the first portion of the second word line.

* * * * *